US006377931B1

(12) United States Patent
Shlomot

(10) Patent No.: US 6,377,931 B1
(45) Date of Patent: Apr. 23, 2002

(54) SPEECH MANIPULATION FOR CONTINUOUS SPEECH PLAYBACK OVER A PACKET NETWORK

(75) Inventor: Eyal Shlomot, Irvine, CA (US)

(73) Assignee: Mindspeed Technologies, Newport Beach, CA (US)

( * ) Notice: Subject to any disclaimer, the term of this patent is extended or adjusted under 35 U.S.C. 154(b) by 0 days.

(21) Appl. No.: 09/407,466

(22) Filed: Sep. 28, 1999

(51) Int. Cl.[7] ......................... G10L 21/04; G01R 29/26; G11B 7/007

(52) U.S. Cl. .................... 704/503; 704/278; 369/44.32; 702/69

(58) Field of Search ................................ 704/201, 500, 704/503, 278; 370/506, 522; 709/219; 369/44.32; 702/69

(56) References Cited

U.S. PATENT DOCUMENTS

| | | | | |
|---|---|---|---|---|
| 5,694,521 A | | 12/1997 | Shlomot et al. | 395/2.71 |
| 5,699,481 A | | 12/1997 | Shlomot et al. | 395/2.37 |
| 5,825,771 A | * | 10/1998 | Cohen et al. | 370/522 |
| 5,881,245 A | * | 3/1999 | Thompson | 709/219 |
| 5,953,695 A | * | 9/1999 | Barazesh et al. | 704/201 |
| 6,212,206 B1 | * | 4/2001 | Ketcham | 370/506 |

OTHER PUBLICATIONS

*Overview of Speech Packetization*, M.H. Sherif and A. Crossman, AT&T Bell Laboratories, © 1995 IEEE, pp. 296–304.

Ansari et al ("Compressed Voice Integrated Services Frame Relay Networks: Voice Synchronization," Conference on Electrical and Computer Engineering, p. 1073–1076 vol. 2, Sep. 5–8, 1995).*

* cited by examiner

*Primary Examiner*—Richemond Dorvil
*Assistant Examiner*—Daniel A. Nolan
(74) *Attorney, Agent, or Firm*—Akin, Gump, Strauss, Hauer & feld, LLP

(57) ABSTRACT

In a speech communications network, continuous play of audio packets is achieved using a jitter buffer in a receiver. Audio packets are stored in the jitter buffer before decoding the audio packets into an audible output. When the level of stored audio packets approaches the full capacity of the jitter buffer, the rate at which the audio packets are played out of the jitter buffer is increased signaling a compression operation in the decoder. When the level of stored audio packets approaches an empty level of the jitter buffer, the rate which the audio packets are played out of the jitter buffer is reduced signaling an expansion operation in the decoder. Audio packets are not modified when the level of stored audio packets is within a predetermined range. A speed controller is provided to instruct the decoder to decode the audio packets according to either a compressed, expanded or normal audio packet status.

20 Claims, 4 Drawing Sheets

SPEECH MANIPULATION FOR CONTINUOUS SPEECH PLAYBACK OVER A PACKET NETWORK

BACKGROUND

1. Field of the Invention

The present invention relates to communication systems and in particular to packet network communication systems.

2. Description of the Related Art

Currently, global and local communication systems are rapidly changing from switched network systems to packet network systems. Packet network systems transmit data, speech, and video. An example of a packet network is the Internet (a globally connected packet network system) or the Intranet (a local area packet network system). While speech communications in switched network systems is carried by a direct point-to-point connection, speech communications in packet network system is performed by packing speech frames and transmitting the frames over the network.

A number of applications for packet networks now exist. For example, in November 1996, the International Telecommunication Union (ITU) and the Telecommunication Standardization Sector (ITU-T) ratified the H.323 specification defines how delay-sensitive voice and video traffic is transported over local area networks. Earlier this year (1999), the ITU-T approved H.323 Revision 2 for use in wide area networks. However, operating H.323 terminals over a wide area network (such as the public Internet) may result in poor performance due to the lack of quality-of-service (QoS) guarantees in packet networks. In the Internet, congestion due to inadequate bandwidth often leads to long delays in the delivery of time-sensitive packets. For voice data, packets that are lost or discarded result in gaps, silence, and clipping in real-time audio playback.

To support a real-time QoS, a new Internet Protocol (IP) network has been proposed, called the Resource Reservation Protocol (RSVP). Using RSVP, both real time and non-real time applications can specify an appropriate QoS over the shared bandwidth of the Internet. However, until an RSVP standard is ratified and implemented in network routers, it is not possible for the end-to-end connections over IP networks to guarantee a QoS equivalent to the PSTN. In addition, IP telephony devices utilize Voice Over Internet Protocol (VOIP) over private and public carrier IP networks (rather than the public Internet) where ample bandwidth can be allocated.

Several drawbacks can jeopardize the quality of the speech transmitted by a packet network. The main drawback is the irregularity (or jitter) in the time of arrival of the packets. Since speech communications is a continuous process, each packet should be available at the receiving end in time for its usage (a packet is used by decoding its content and playing the decoded speech to the listener). A problem arises, for example, if a few packets are delayed at a node of the packet network. At the receiving end, since the speech packets have not arrived, the listener will experience a discontinuity in speech. Moreover, when the packets finally arrive to their destination, they might arrive too late to be used, and will be dropped. In this case, the listener will lose some of the speech information.

One possible solution for the irregular time of arrival of speech packets has been the buffering of several speech packets before using them to produce the speech. The speech packets are put in a FIFO (First-In-First-Out) buffer type, which holds several packets. Such a buffer is commonly called a jitter buffer. If the number of delayed packets is less than the size of the buffer, then the buffer will not become empty, and the listener will not experience speech discontinuity or lost. The greater the potential jitter, the larger the buffer has to be, in order to give more room for the playback of previous packets while waiting for the subsequent arrival of later packets. However, the intermediate buffer does introduce an overall delay that is proportional to the buffer size.

A large size jitter buffer can overcome several irregularities in packet arrival time, but results in intolerable delay, while a small size jitter buffer introduces only a small delay, but recovers only a limited level of packet time-of-arrival jitter. The proper jitter buffer size is a system design concern, which should be determined according to the allowable speech communications delay, the expected network delays, and the tolerable reduction in speech quality due to discontinuities and losses.

Packet loss leads to unpleasant signal degradation. Small amounts of packet loss have been dealt with in a number of manners. One solution has been to employ packet replay, where the receiver merely repeats the last packet to fill in the time until the next packet actually arrives. However, where packet loss may be more substantial, such as where a Voice Over Internet Protocol (VOIP) signal passes over the Internet, simple packet replay has not been effective.

Another solution to minimize delay caused by a jitter buffer has been to dynamically monitor the jitter and adjust the buffer size accordingly. Commonly assigned U.S. Pat. No. 5,699,481 proposes the management of a jitter buffer by tracking the current number of speech packets stored in the jitter buffer. When the buffer approaches its full capacity, packets are removed from the jitter buffer. When the buffer approaches its empty level, "artificial" packets are inserted into the jitter buffer.

SUMMARY OF THE INVENTION

In a speech communications network, continuous play of received audio packets is achieved using a jitter buffer in a receiver. Audio packets are first temporarily stored in the jitter buffer before decoding of the audio packets into an audible output. A consistent accumulation level of the received audio packets in the jitter buffer is maintained to provide continuous and synchronized output to a decoder. When the level of stored audio packets approaches the full capacity of the jitter buffer, the rate at which the audio packets are played out of the jitter buffer is increased. The increased output rate is achieved by compressing a portion of the stored audio packets to reduce the number of audio packets in the jitter buffer. When the level of stored audio packets approaches an empty level of the jitter buffer, the rate which the audio packets are played out of the jitter buffer is reduced. The reduced output rate is achieved by expanding a portion of the stored audio packets to increase the number of audio packets in the jitter buffer. Audio packets are not modified when the level of stored audio packets is within a predetermined range, such that the rate of incoming audio packets received by the jitter buffer approximately equals the rate of decoded audio packets. A speed controller is then provided to instruct the decoder to decode the audio packets from the jitter buffer according to either a compressed, expanded or normal audio packet status.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF PREFERRED EMBODIMENT

The following related patent applications are hereby incorporated by reference as if set forth in their entirety:

U.S. Pat. No. 5,699,481, entitled "TIMING RECOVERY SCHEME FOR PACKET SPEECH IN MULTIPLEXING ENVIRONMENT OF VOICE WITH DATA APPLICATIONS," granted on Dec. 16, 1997 to Eyal Shlomot, et. al.; and U.S. Pat. No. 5,694,521, entitled "VARIABLE SPEED PLAYBACK SYSTEM," granted on Dec. 2, 1997 to Eyal Shlomot, et. al.

The illustrative system described in this patent application provides a buffer management technique for speech packets over a communications network. For purposes of explanation, specific embodiments are set forth to provide a thorough understanding of the illustrative system. However, it will be understood by one skilled in the art, from reading the disclosure, that the technique may be practiced without these details. Further, although the embodiments are described in terms of a jitter buffer, it should be understood that this embodiment is illustrative and is not meant in any way to limit the practice of the disclosed system to other timing management devices. Also, the use of the terms speech packet to illustrate how the system works is not intended to infer that the illustrative system requires a specific type of audio signal. Rather, any of a variety of segmented communications may be employed in practicing the technique described herein. Moreover, well-known elements, devices, process steps, and the like, are not set forth in detail in order to avoid obscuring the disclosed system.

Figure 1:
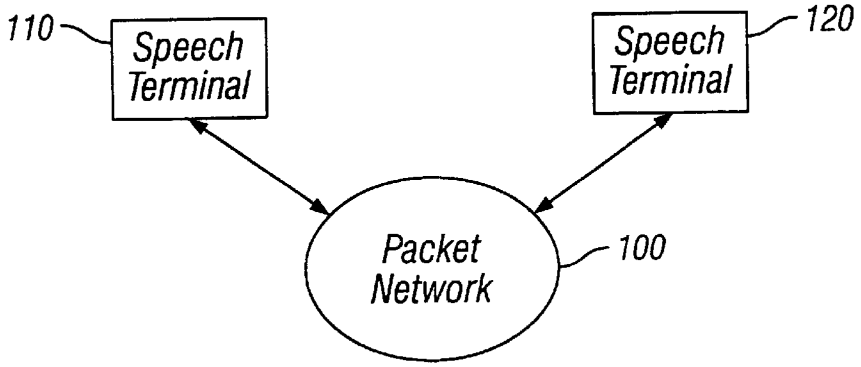
FIG. 1 (Prior Art)
FIG. 1 is a block diagram of an exemplary speech communication packet network.

A typical structure and operation mode of speech communication using a packet network is depicted in FIG. 1. Speech terminals 110 and 120 are connected to the packet network 100, each transmitting speech packets to the network and receiving speech packets from the network. It should be noted that each or any speech terminal can be combined with a data and/or visual terminal (not shown). Also, several speech terminals can be connected simultaneously to each other by the network, in what is commonly called a "conference call."

Figure 2:
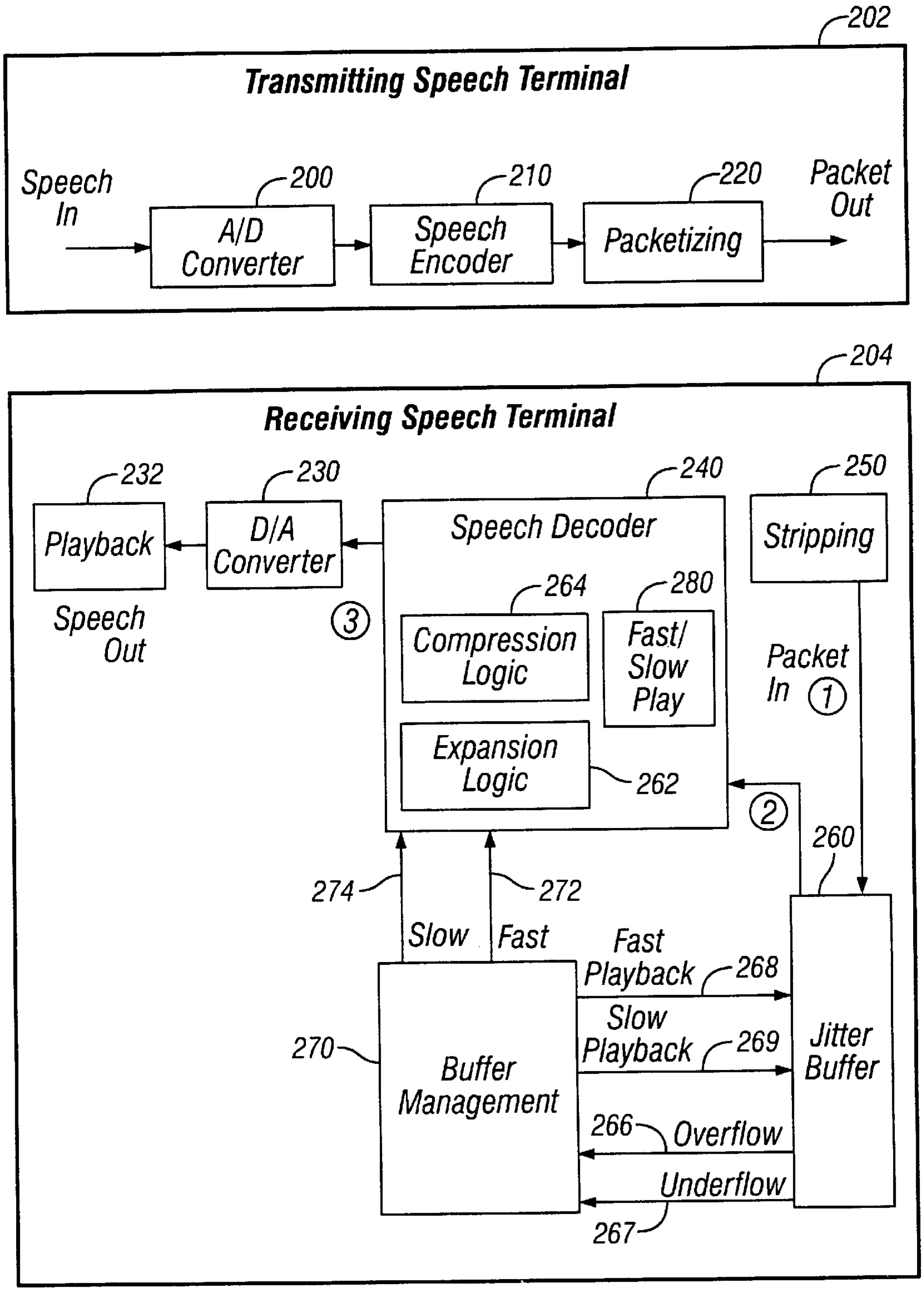
FIG. 2 is a block diagram of a transmitting speech terminal and a receiving speech terminal.

The structure of each speech terminal is given in FIG. 2. An audio input is introduced into the system as an input to the transmitting speech terminal 202. An analog to digital (A/D) converter 200 receives the audio input as an analog signal, specifically an audio waveform. The A/D converter 200 converts the analog speech signal into a sampled and digital form, suitable for digital signal processing. The A/D converter 200 is well-known in the industry and conversion of an analog signal into digital form may be done in any number of ways understood by persons skilled in the art, such as discrete sampling. The digital signal is then forwarded to a speech encoder 210. The speech encoder 210 further digitizes and encodes the signal with the appropriate number of bits according to speech compression algorithms, which are also well-known in the industry. The speech encoder 210 may be used through a variety of encoder/decoder (codec) standards in the industry, for example, the G.7xx codec series as specified by the International Telecommunications Union. Finally, a bit packetizing unit 220 receives the digitized audio signal and packs the bits in packets of a predetermined size, which we term Coded Speech Packages (CSPs). Additional handling or manipulation of the packets, not shown in this diagram, can include protection, encryption, and concatenation with traffic information headers, such as destination address.

The packet is then transmitted across the packet network to a receiving speech terminal 204. Prior to the packet's receipt by the receiving speech terminal 204, the transmitted packet is routed over various transmission paths within the packet network 100 (FIG. 1). Depending on the particular transmission route chosen and the network traffic condition, significant delay may occur between sequential packets transmitted from the transmitting speech terminal 202. Specifically, because each packet may have traveled along a different route, one packet may travel faster or slower than another packet. In addition, some packets may have been dropped altogether to ease system congestion and will need to be transmitted again by the transmitting speech terminal 202. Other delays may occur as a result of hardware either within the transmitting speech terminal 202 or other hardware within the packet network 100, such as nodes of routers.

The CSPs are received from the packet network 100 at the receiving speech terminal 204, which includes a stripping unit 250, a jitter buffer 260, a buffer management unit 270, a speech decoder 240, and a digital to analog D/A converter 230. It is a characteristic of some packet networks to include routing information including control address and data information within each packet. The stripping unit 250 removes the control and address information to facilitate the subsequent conversion by first the speech decoder 240 and ultimately the D/A converter 230. The jitter buffer 260 acts as an intermediate buffer at the receiver end, allowing the packets to be played out of the jitter buffer 260 at a regular or standard predetermined replay rate by other hardware in the receiving speech terminal 204 independent of the rate of arrival of the packets. Specifically, the jitter buffer 260 stores incoming speech packets before the packets are replayed. The stored packets can then be played out of the jitter buffer 260 at the regular predetermined replay rate without transferring packet data during the irregular arrival times between sequential speech packets. A regular operation mode of the speed decoder would be to decode one CSP into a single speech segment of a predetermined length, for example, 20 ms.

According to an embodiment of the present invention, the speech decoder 240 includes compression logic 264, expansion logic 262 and a fast/slow play unit 280. When the fast playback is enabled, the compression logic 264 compresses multiple speech packets into a reduced number of speech segments by the speech decoder 240. When slow playback is enabled, the expansion logic 262 expands at least one speech packet into an increased number of speech segments by the speech decoder 240. Compression is initiated upon assertion of the fast signal 272 from the buffer management unit 270 when the overflow signal 266 indicates a overflow condition exists in the jitter buffer 260. Expansion is initiated upon deassertion of the slow signal 274 from the buffer management unit 270 when the underflow signal 267 indicates a underflow condition exists in the jitter buffer. Compression and expansion of stored speech packets is more fully discussed in connection with FIGS. 3 and 4.

From the jitter buffer 260, the stored CSPs are released according to the playback rate signals 268 and 269 to the decoder 240. The speech decoder 240 then decodes the bit information further into digital form suitable for conversion by the D/A converter 230. Finally, the D/A converter 230 converts the digitized speech signal into an analog signal for playback by the playback unit 232 that is representative of the audio input that began the process at the transmitting speech terminal 202.

According to a disclosed embodiment, the buffer management unit 270 monitors the contents of the jitter buffer 260. In addition, the buffer management unit 270 sends control signals to the fast/slow play unit 280 to control the flow or transfer rate of CSPs released out of the jitter buffer 260 and the decode rate of packets from the jitter buffer 260. Depending upon the capacity of the jitter buffer 260, the buffer management unit 270 enables either a fast playback or a slow playback in the fast/slow play unit 280. Specifically, when the jitter buffer 260 is relatively full, fast play is enabled. When the jitter buffer 260 is relatively empty, slow play is enable. When fast playback is enabled for packets out of the jitter buffer 260, indicated by asserting the overflow signal 266, the buffer management unit 270 provides a fast-play signal to the decoder 240 via the fast/slow play unit 280 and the fast playback rate signal 268 is asserted. When slow playback is enabled for packets out of the jitter buffer 260, indicated by asserting the underflow signal 267, the buffer management unit 270 provides a slow-play signal to the decoder 240 via the fast/slow play unit 280 and the slow playback rate signal 269 is asserted.

It should be noted that although the above described units are illustrated as separate units for exemplary purposes, it should be understood that some units might be combined in alternative embodiments. For example, the buffer management unit 270 and the fast/slow play unit 280 can be integrated without departing from the disclosed invention. Likewise, the compression logic 264 and the expansion logic 262 can be separated from the decoder unit 240 without departing from the disclosed invention.

Figure 3:
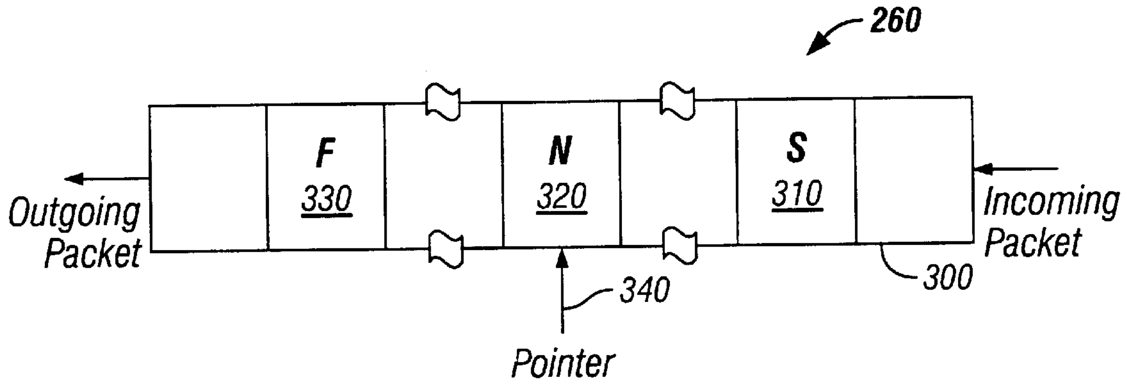
FIG. 3 is a block diagram of an exemplary jitter buffer structure of FIG. 2.

Turning now to FIG. 3, shown is a more detailed block diagram of the jitter buffer 260. The size of the jitter buffer 260 can be any size permissible by the specific communications within the packet network 100. Because the delay introduced by the jitter buffer 360 is directly proportional to its size, it is preferable to minimize the size of the jitter buffer 260, while meeting the design considerations that will allow any irregularity in transmitted CSPs to be accounted for by the jitter buffer 260. Each location in the jitter buffer 300 holds a CSP. A pointer 340 points to the CSP that is to be decoded and played next. The jitter buffer locations to the left of the pointer 340 hold CSPs that have already been played (and in that sense, these locations can be considered to be empty). The jitter buffer locations to the right of the pointer 340 hold CSPs that have not yet been played. There can be any number of locations between the N (Normal) location 320 and the F (Fast) location 330 and between the N location 320 and the S (Slow) location 310. When a CSP has been decoded and played, the pointer 340 is moved one location to the right. When a new CSP is received from the network 100, the new CSP is pushed into the jitter buffer 260 from the right. All of the unplayed CSPs are shifted one location to the left, and the pointer 340 is also moved one location to left. Note, that although the pointer 340 is positioned on the N location 320 in FIG. 3, it can actually point to any location in the jitter buffer 300.

The rate of the CSP decoding and playing is constant at a predetermined standard playback rate. If the rate at which the CSPs arrive from the packet network 100 is the same as the predetermined playback rate at which the CSPs are decoded and played, the pointer 340 remains at the N (Normal) location 320, or one location to the left or to the right. However, if the temporary rate of CSP arrival from the packet network 100 is higher than the predetermined replay rate of CSP decoding and playing, more CSPs will be added to the jitter buffer 260, the pointer 340 is shifted to the left and the overflow signal 266 (FIG. 2) is asserted. On the other hand, if the temporary rate at which the CSPs arrive from the network 100 is lower than the predetermined playback rate at which the CSPs are decoded and played, more CSPs will be taken out of the jitter buffer 260, the pointer 340 is shifted to the right and the underflow signal 267 is asserted.

According to another embodiment of the present invention, an overflow or underflow condition only occurs when the pointer 340 reaches a predetermined high or low level threshold of the jitter buffer 260. Specifically,the overflow signal 266 is asserted only when the pointer 340 is moved passed a predetermined high level threshold of the jitter buffer 260. The predetermined high level threshold represents a rate of incoming packets received by the jitter buffer 260 that exceeds the standard playback rate by a certain high threshold rate. Likewise, the underflow signal 267 is asserted only when the pointer 340 is moved passed a predetermined low level threshold of the jitter buffer 260. The predetermined low level threshold represents a rate of incoming packets received by the jitter buffer 260 that is lower than the standard replay rate by a certain low threshold rate. Thus, slight changes in the rate of receipt of incoming packets will not trigger the disclosed fast or slow play manipulation.

Without a buffer management scheme, if the jitter in the time of arrival of the CSPs from the network exceeds a certain level, a jitter buffer can overflow or underflow. An overflow danger is detected when the pointer 340 approaches the F location 330, and an underflow danger is detected when the pointer 340 approaches the S location 310. According to a disclosed embodiment, the overflow indicator from the pointer 340 is used to signal a compression function for merging a number of stored speech packets into a smaller number of speech segments by the speech decoder 240. Such a compression function is described more fully in commonly assigned U.S. Pat. No. 5,694,521 for variable speed playback of digital storage retrieval systems. Specifically, as the number of CSPs stored in the jitter buffer 260 approaches the full capacity of the jitter buffer 260, the buffer management unit 270 will detect an overflow indicator from the pointer 340 over the overflow signal 266. The buffer management unit 270 will initiate a compression function in the speech decoder 240 where a predetermined number of speech segments are compressed into a reduced number of speech segments. The simplest merging procedure will be the merging of two CSPs into a single speech segment, but it is also possible, for example, to merge three CSPs into two or one segments, or any other number of combination. For example, a CSP each represent a decoded speech segment of 20 ms. For a compression operation, the compression logic together 264 with the speech decoder 240 combines two CSPs to produce a speech segment of a size of 20 ms. Thus, fast playback is performed by merging a number of speech segments represented by a number of speech packets into a smaller number of speech segments while keeping the original short-term spectrum and pitch. However, it should be understood that different combinations of spectrum and pitch can be achieved with minor modifications of the disclosed embodiment.

In addition, an underflow indicator from the pointer 340 is used to signal an expansion function for expanding a number of speech segments represented by a number of speech packets into a larger number of speech segments. Such an expansion function is described more fully in commonly assigned U.S. Pat. No. 5,694,521 for variable speed playback of digital storage retrieval systems. Specifically, as the number of CSPs stored in the jitter buffer 260 approaches the empty capacity of the jitter buffer 260, the buffer management unit 270 will detect an underflow indicator from the pointer 340 over the underflow signal 267. A number of speech segments represented by a number of CSPs are then expanded resulting in an increased number of speech segments. Slow playback is performed by expanding a number of CSPs into a larger number of segments, while keeping the original short-term spectrum, pitch, or other basic speech features.

From the jitter buffer 260 perspective, fast playback can be viewed as an increase in the rate of outgoing packets, and slow playback can be viewed as a decrease in the rate of outgoing packets. Fast play from the jitter buffer 260 is initiated by asserting of the fast playback rate signal 268, while slow pay is initiated by asserting the slow playback rate signal 269. In both cases, the speech manipulation can be performed for active and non-active speech. Fast play of the speech will increase the rate in which the CSPs are played out of the jitter buffer 260. Fast play results in compression of speech segments into a reduced number of speech segments such that an outgoing speech segment from the decoder 240 is a single compressed version of multiple speech segments. Therefore, because multiple speech segments represented by the received CSPs are contained in the compressed outgoing speech segments, the rate of exiting CSPs will exceed the rate of incoming CSPs. Alternatively, slow play will reduce the rate in which the CSPs are played out of the jitter buffer 260. Slow play results in expansion of speech segments into an increased number of speech segments such that an outgoing speech segment from the decoder 240 is an expanded version of only a portion of a speech segment. Therefore, because only a portion of a speech segment represented by an incoming CSP is contained in the expanded outgoing speech segment, the rate of exiting CSPs will be lower than the rate of incoming CSPs.

If there is no jitter in the time of arrival of the packets from the network 100, the jitter buffer 260, the buffer management unit 270, and the fast/slow play unit 280 operate to pass the audio signal through the decoder path in a reverse manner to the encoder path. No compression or expansion is performed. The CSPs are then stripped to the bits. The bits are decoded to generate the sampled and digitized speech, which is then converted into an analog signal by the D/A converter.

Figure 4A:
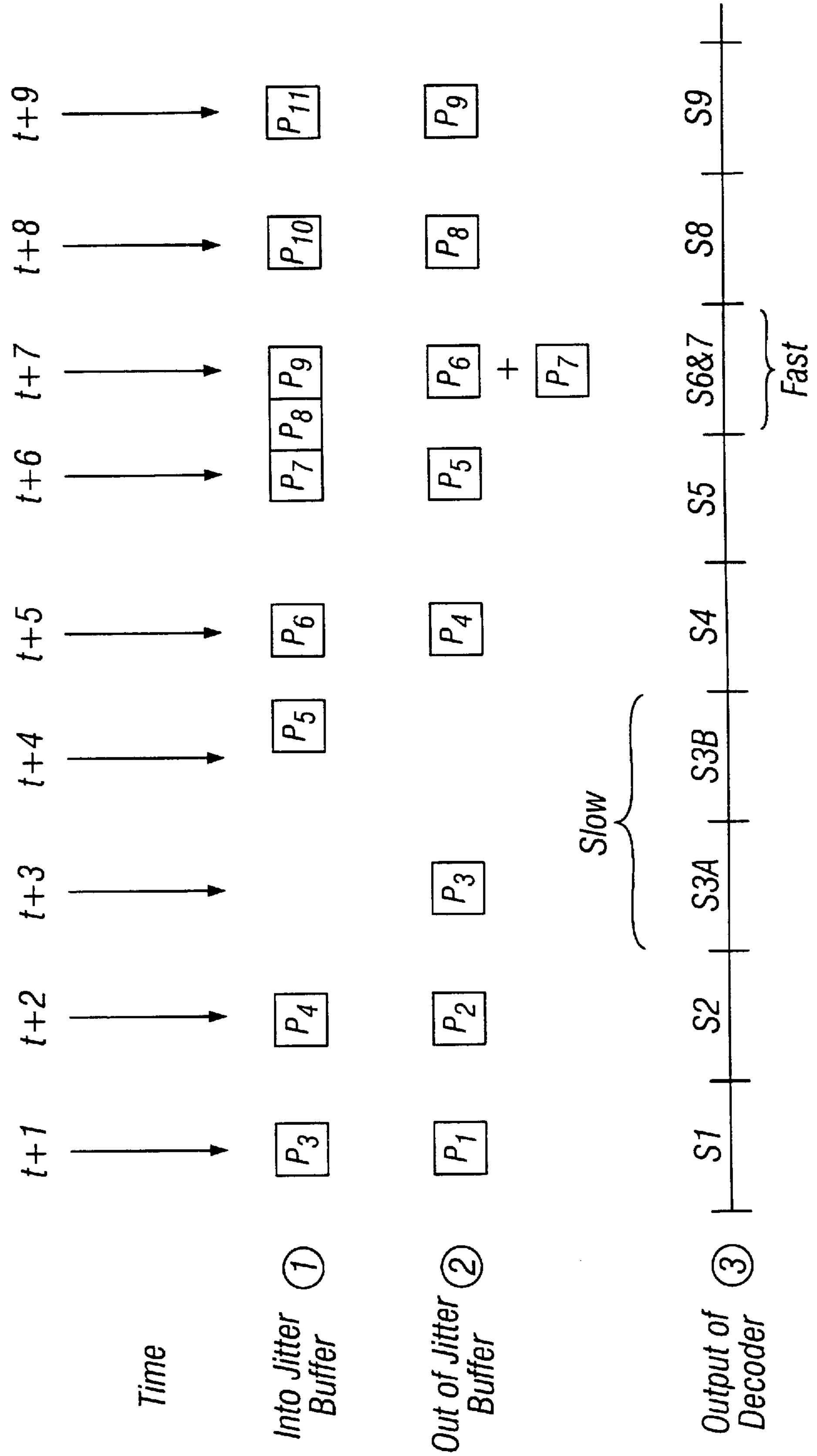
FIGS. 4*a* and 4*b* are timing illustrations for packets communicated over the speech communication packet network of FIG. 1 and FIG. 2.

Turning now to FIG. 4*a*, illustrated is an exemplary timing relationship between sequential speech packets received from the packet network 100 (FIG. 1). The top set of packets represents the jitter buffer input at location ① as shown in FIG. 2. Because of various delays within the transmitting speech terminal 202 and/or various delays within the packet network 100, the stream of transmitted packets is received by the jitter buffer 260 in an asynchronous manner. Specifically, the packets P3, P4, P9, P10 and P11 arrive at the right time, while P5, P6, P7 and P8 arrive late. Note the sparse arrival time of P5 and P6, which is compensated by the dense arrival time of P7 and P8.

According to a disclosed embodiment, a normal event occurs where the time of arrival for incoming packets to the jitter buffer 260 is approximately equal to the predetermined standard replay rate for subsequent decoding and converting of the audio signal. A fast arrival event occurs when the rate of arrival of packets into the jitter buffer 260 is significantly higher than the predetermined replay rate for subsequent decoding and converting of the audio signal into an audible output. Finally, a slow event occurs when the rate of arrival between packets into the jitter buffer 260 is significantly lower than the predetermined replay rate for subsequent decoding and converting of the packets into an audible output. According to another embodiment of the present invention, a fast or slow event occurs only when the incoming rate of received packets exceeds a high threshold rate corresponding to a high threshold level in the jitter buffer 260 or is lower than a low threshold rate corresponding to a low threshold level in the jitter buffer 260, respectively.

The middle packet stream represents the output of packets from the jitter buffer 260 at location ② shown on FIG. 2. Since P5 does not arrive at time t+3, a slow event at time t+3 occurs. The buffer management unit 270 signals the speech decoder 240 of the slow event by asserting the slow signal 274. Expansion logic 262 in the speech decoder 240 expands the P3 speech packet such that subsequent decoding results in speech packets S3A and S3B over two output speech segments. Speech segments S3A and S3B are the decoded speech signal information represented by the pre-decoded speech packet P3. P6 and P7 arrive late, but since P3 was already expanded, the buffer is not empty and P4 and P5 are played at a normal rate. Since P8 now arrives before P6 is played, P6 and P7 are played out of the jitter buffer 260 in a fast play mode during time t+7. Upon a fast event at time t+6 and t+7, the buffer management unit 270 signals the speech decoder 240 of the fast event by asserting the fast signal 272. Compression logic 264 in the speech decoder 240 compresses the P6 and P7 speech packets such that subsequent decoding results in speech packet S6+7. Speech packet S6+7 is the decoded speech signal information represented by both the pre-decoded speech packets P6 and P7.

As described above, although a 2:1 fast play mode is shown for exemplary purposes, any ratio of fast play may occur where the outgoing CSP from the jitter buffer 260 consists of more than one of the CSPs stored within the jitter buffer 260. The slow arrival event at time t+3 results in a slow play mode at times t+3 and t+4. Specifically, the packets received by the jitter buffer 260 are output at a slower rate than the predetermined replay rate. Here again, although a 1:2 slow play mode is shown for exemplary purposes, any ratio of slow play may be used.

Finally, the bottom stream of speech segments illustrates the timing for subsequent decoding and converting of the speech packets into corresponding speech segments, at location ③ shown in FIG. 2. The consistent time of arrival interval of the bottom stream of speech segments may be any predetermined time interval, 20 ms for example. It is this regular and consistent rate of arrival on which smooth and continuous audible output relies.

It is important to note that the compression and expansion operations are performed on speech packets output from the jitter buffer 260 at a time when the arrival of speech packets into the jitter buffer 260 signals such operation. Therefore, since the output of the jitter buffer 260 is delayed from the input, the compression and expansion operations are not necessarily performed on the speech packets, or the speech segments represented by the speech packets, that actually cause the signaling of either the fast or slow play mode.

Figure 4B:
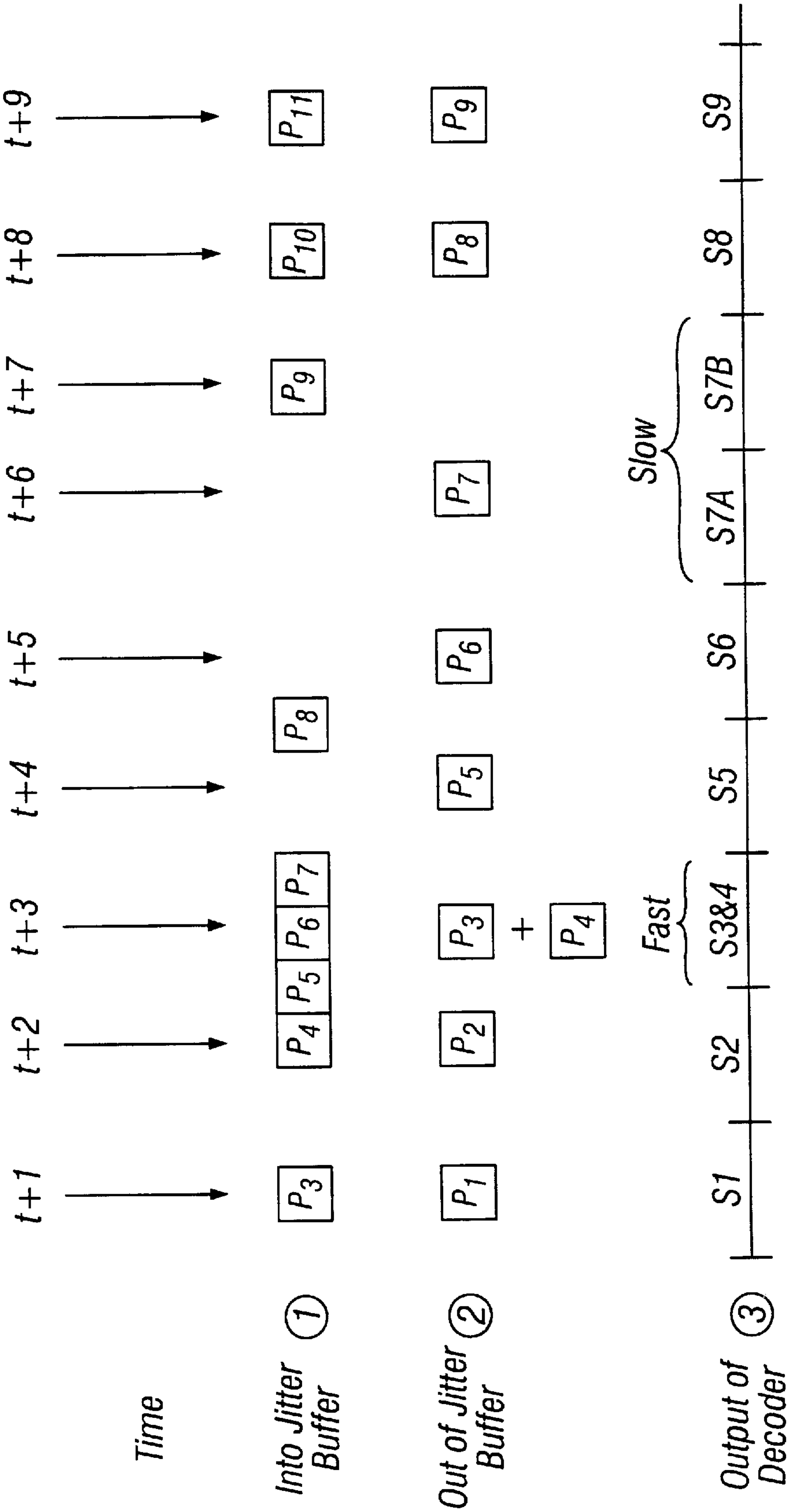

Turning to FIG. 4*b,* another example is illustrated where the rate of arrival of speech packets results in either normal, compressed or expanded decoding into speech segments. Since a fast event occurs from an accelerated arrival of packets at time t+3, the packets in the jitter buffer 260 are played out at a faster rate such that P3 and P4 are played in a single segment. From this output the compression logic 264 is initiated allowing the decoder 240 to output a single compressed speech segment containing speech information represented by both P3 and P4. Similarly, the slow arrival at time t+6 results in expanded speech segments S7A and S7B over two speech segments.

The fast or slow play can be performed for all speech segments, both silent and active. In this way immediate and continuous jitter buffer manipulation is achieved without removing speech segments or inserting artificially generated speech segments. It is also possible to restrict jitter buffer manipulation to stationary voiced, stationary unvoiced, and inactive speech segments, and to avoid jitter buffer manipulation during the non-stationary portions of the speech, such as transitions. With this approach, it is estimated that more than 90% of the speech segments can be manipulated without audible speech quality degradation. By avoiding the buffer correction during transition speech, where the fast/slow playback can introduce some distortion, the speech quality is increased while still able to perform an efficient buffer manipulation.

According to an alternate embodiment, a buffer management scheme is provided with several degrees of overflow and underflow danger. As the pointer 340 starts to move to the left or to the right of the jitter buffer 260, the level of danger can be increased. According to the level of overflow/underflow danger, the urgency in the need for buffer manipulation is increased, and accordingly, the level of manipulation. For example, on a low level of overflow urgency, the fast play will only combine 3 segments of speech into 2 segments (3:2 faster ratio) and will operate only during stationary speech, stationary unvoiced, or inactive speech segments. As the level of overflow urgency increases, for example, the fast play can start to combine 2 segments into a single segment (2:1 faster ratio) and can perform the speech manipulation for all segments, regardless of their nature.

Therefore according to a disclosed embodiment, continuous play of asynchronously transmitted speech packets is provided through manipulation of data packets within a jitter buffer. An overflow indicator signals the receiving terminal to accelerate the rate of play of outgoing packets from the jitter buffer. Playback is accelerated by compressing a predetermined number of speech packets into a reduced number of speech segment. Alternatively, an underflow indicator instructs the receiving terminal to decelerate playing of outgoing speech packets from the jitter buffer. Deceleration is achieved by expanding a predetermined number of speech packets within the jitter buffer into an increased number of speech segment in the decoder output. Subsequent decoding of the packets from the jitter buffer is performed according to a fast or slow play status corresponding to the packet to be decoded. Specifically, compressed speech packets are decoded according to a fast decode algorithm while expanded speech packets are decoded according to a slow decode algorithm. In this way, delay resulting from asynchronous time of arrival between sequential speech packets is avoided by providing outgoing speech packets from the jitter buffer at a suitable rate. In addition, jitter buffer management is achieved without removing portions of the transmitted packets or by adding artificially generated packets to the sequence of the packets in the jitter buffer. The disclosed jitter buffer management techniques address many of the concerns associated with jitter buffers.

The foregoing disclosure and description of the various embodiments are illustrative and explanatory thereof, and various changes in communication network, the descriptions of the jitter buffer, the receiver, and other circuitry, the organization of the components, and the order and timing of steps taken, as well as in the details of the illustrated system may be made without departing from the spirit of the invention.

I claim:

1. A method of controlling playback of audio signals over a communication network, the method comprising:

receiving a plurality of audio packets;

storing temporarily the plurality of audio packets;

executing playback of the plurality of audio packets;

compressing the plurality of audio packets to accelerate the playback of the plurality of audio packets when a rate of receipt of audio packets is greater than a predetermined upper replay rate; and decompressing the plurality of audio packets to decelerate the playback of the plurality of audio packets when the rate of receipt of the plurality of audio packets is less than a predetermined lower replay rate.

2. The method of claim 1, further comprising:

decoding the plurality of audio packets.

3. The method of claim 1, the accelerating step further comprising:

compressing an audio packet.

4. The method of claim 3, wherein the compressing step reduces the number of the plurality of audio packets.

5. The method of claim 1, the accelerating step further comprising:

compressing a speech segment represented by an audio packet.

6. The method of claim 1, the decelerating step further comprising:

expanding an audio packet.

7. The method of claim 6, wherein the expanding step increases the number of the plurality of audio packets.

8. The method of claim 1, the decelerating step further comprising:

expanding a speech segment represented by an audio packet.

9. The method of claim 1, further comprising the step of:

detecting the rate of receipt of the plurality of audio packets.

10. The method of claim 9, the plurality of audio packets being stored in a jitter buffer, detecting step comprising the step of:

determining a location of a jitter buffer using an address pointer of the jitter buffer.

11. The method of claim 10, wherein the jitter buffer address pointer points to an address of the jitter buffer corresponding to a relatively full level of the jitter buffer when the rate of receipt of the audio packets is higher than the predetermined replay rate and the jitter buffer address pointer points to an address of the jitter buffer corresponding to a relatively empty level of the jitter buffer when the rate of receipt of the audio packets is lower than the predetermined replay rate.

12. A receiver configured for continuous playback of audio packets, the receiver comprising:

a jitter buffer to store a plurality of audio packets;

a jitter buffer controller coupled to the jitter buffer to monitor capacity of the jitter buffer, the jitter buffer controller accelerating playback of the plurality of audio packets out of the jitter buffer when a rate of receipt of the plurality of audio packets is greater than a predetermined upper replay rate and decelerating the playback of the plurality of audio packets out of the jitter buffer when a rate of receipt of the plurality of audio packets is lower than a predetermined lower replay rate; and a decoder to decode the stored audio packets, the decoder compressing an audio packet when a rate of receipt of the plurality of audio packets is greater than a predetermined upper replay rate, the decoder expanding an audio packet when the rate of receipt of the plurality of audio packets is lower than the predetermined lower replay rate.

13. The receiver of claim 12, wherein the jitter buffer controller provides a fast play signal to the decoder during accelerated playback and provides a slow play signal to the decoder during decelerated playback.

14. The receiver of claim 12, wherein the jitter buffer provides an overflow indicator signal to the buffer controller to initiate accelerated playback and the jitter buffer provides an underflow indicator signal to initiate decelerated playback.

15. The receiver of claim 12, the decoder compressing an audio packet when a rate of receipt of the plurality of audio packets is greater than a predetermined upper replay rate, the decoder expanding an audio packet when the rate of receipt of the plurality of audio packets is lower than the predetermined lower replay rate.

16. The receiver of claim 12, wherein a compressed audio packet is decoded according to a corresponding compression decode algorithm and an expanded audio packet is decoded according to a corresponding expansion decode algorithm.

17. A communications network configured for continuous playback of asynchronously transmitted audio packets, comprising:

a transmitter to transmit an audio packet;

a receiver to receive an audio packet, comprising:

a jitter buffer for storing received audio packets;

a jitter buffer controller coupled to the jitter buffer to monitor capacity of the jitter buffer, the jitter buffer controller accelerating playback of the plurality of audio packets out of the jitter buffer when a rate of receipt of the plurality of audio packets is greater than a predetermined upper replay rate and decelerating the playback of the plurality of audio packets out of the jitter buffer when a rate of receipt of the plurality of audio packets less than a predetermined lower replay rate;

a decoder to decode the stored audio packets, the decoder compressing a speech segment represented by an audio packet when a rate of receipt of the plurality of audio packets is greater than a predetermined upper replay rate, the decoder expanding a speech segment represented by an audio packet when the rate of receipt of the plurality of audio packets is lower than the predetermined lower replay rate;

a converter for converting the audio packets into an audible signal; and a playback device for replaying the audible signal at the predetermined replay rate.

18. The communications network of claim 17, wherein the jitter buffer provides an overflow indicator signal to the buffer controller to initiate accelerated playback and the jitter buffer provides an underflow indicator signal to initiate decelerated playback.

19. The communications network of claim 17, wherein the jitter buffer controller provides a fast play signal to the decoder during accelerated playback and provides a slow play signal tot the decoder during decelerated playback.

20. The communications network of claim 17, wherein a compressed speech segment is decoded according to a corresponding compression decode algorithm and an expanded speech segment is decoded according to a corresponding expansion decode algorithm.

* * * * *

UNITED STATES PATENT AND TRADEMARK OFFICE

CERTIFICATE OF CORRECTION

PATENT NO. : 6,377,931 B1
DATED : April 23, 2002
INVENTOR(S) : Eyal Shlomot

It is certified that error appears in the above-identified patent and that said Letters Patent is hereby corrected as shown below:

Column 11,
Lines 31-36, pleae delete claim 15.

Column 11, lines 37-43 through Column 12, lines 1-41,
Renumber claims 16-20 as claims 5-19.

Signed and Sealed this

Sixth Day of May, 2003

JAMES E. ROGAN
*Director of the United States Patent and Trademark Office*